United States Patent
Hughes

(10) Patent No.: US 7,352,242 B1
(45) Date of Patent: Apr. 1, 2008

(54) PROGRAMMABLE GAIN TRIM CIRCUIT

(75) Inventor: Rodney Alan Hughes, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 41 days.

(21) Appl. No.: 11/241,172

(22) Filed: Sep. 30, 2005

(51) Int. Cl.
*H03F 3/45* (2006.01)

(52) U.S. Cl. ............... 330/254; 330/278; 330/86

(58) Field of Classification Search ........... 330/2, 330/129, 254, 278, 307
See application file for complete search history.

(56) References Cited

U.S. PATENT DOCUMENTS 6,020,785 A * 2/2000 Allen et al. ............... 330/2

* cited by examiner

*Primary Examiner*—Robert Pascal
*Assistant Examiner*—Hieu Nguyen
(74) *Attorney, Agent, or Firm*—Brett A. Hertzberg; Merchant & Gould PC

(57) ABSTRACT

A programmable gain amplifier includes a first gain setting circuit and a second gain setting circuit that are both coupled to an output of an amplifier. A trim adjustment circuit is and arranged to complete feedback to the amplifier by digitally panning between the first gain setting and the second gain setting based on a trim setting. The trim setting can be provided by a look-up table that is indexed with gain settings. The first and the second gain setting circuits can each include an array of series coupled resistors, where a tap point from each array is selectively coupled to the trim adjustment circuit for adjusting the overall gain. The first and second gain setting circuits can be matched to one another, with the addition of a gain offset circuit that is configured to skew the nominal gain values between the first and second gain setting circuits.

20 Claims, 9 Drawing Sheets

PROGRAMMABLE GAIN TRIM CIRCUIT

FIELD OF THE INVENTION

The present disclosure generally relates to electronic circuits. More particularly, the present disclosure relates to a technique for trimming the gain associated with a programmable gain amplifier.

BACKGROUND

Many electronic systems employ programmable gain amplifiers as a basic analog building block. An example of a conventional programmable gain amplifier (900) is illustrated in FIG. 9. Programmable gain amplifier 900 includes an operational amplifier (AMP9), three resistors (R91-R93), and two switches (S91-S92). The operational amplifier includes a non-inverting input terminal (INP), an inverting input terminal (INM), and an output terminal (AOUT). Switch S91 is connected between AOUT and node N91. Switch S92 is connected between AOUT and node N92. Resistor R91 is connected between node N91 and INM. Resistor R92 is connected between node N92 and INM. Resistor R93 is connected between INM and a circuit ground (GND).

In operation, operational amplifier AMP9 is configured to receive an input signal (e.g., IN) at the non-inverting input (INP), and provide an output signal (e.g. OUT) at the output terminal (AOUT) that is related to the input signal according to a gain scaling factor (X). The gain scaling factor (X) is determined by the impedance in the feedback path between the output (OUT) and the inverting input (INM).

Switches S91 and S92 are arranged to change the selection of the feedback components (resistors R91 and R92) to adjust the gain scaling factor (X). The selected feedback component is resistor R91 when switch S91 is closed, while the selected feedback component is resistor R92 when switch S92 is closed. The relationship between the input signal (IN) and the output signal (OUT) is determined by the feedback components and the switches as follows: OUT=IN*(1+X), where X is determined by the feedback components. In one example, X=R91/R93 when switch S1 is closed and switch S2 is open. In another example, X=R92/R93 when switch S2 is closed and switch S1 is open.

BRIEF DESCRIPTION OF THE DRAWINGS

Non-limiting and non-exhaustive embodiments are described with reference to the following drawings.

DETAILED DESCRIPTION

Figure 1:
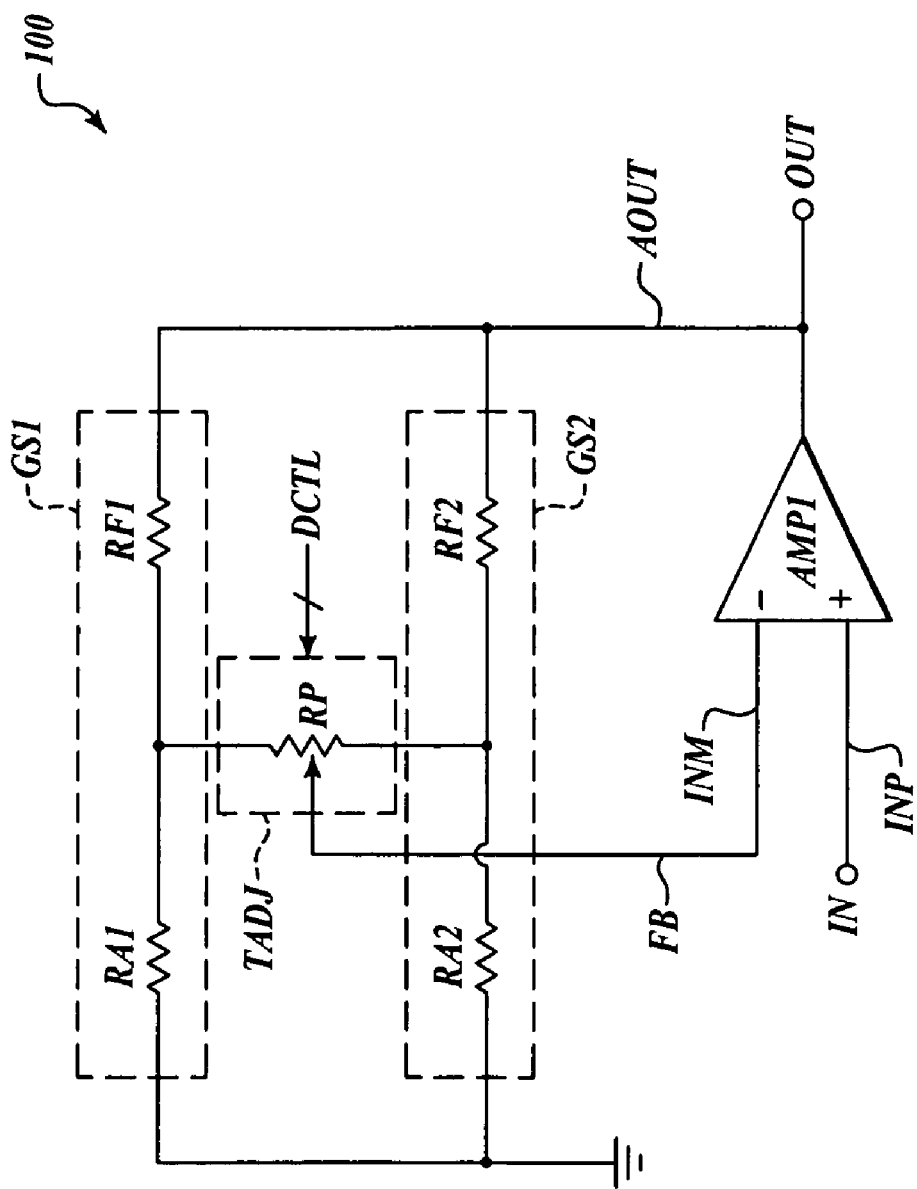
FIG. 1 is a schematic of an example programmable gain amplifier circuit that is arranged according to at least one aspect of the present disclosure.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to an apparatus and method for trimming gain adjustments in a programmable gain amplifier. The programmable gain amplifier includes a first gain setting circuit and a second gain setting circuit that are both coupled to an output of an amplifier. A trim adjustment circuit is and arranged to complete feedback to the amplifier by digitally panning between the first gain setting and the second gain setting based on a trim setting. The trim setting can be provided by a look-up table that is indexed with gain settings. The first and the second gain setting circuits can each include an array of series coupled resistors, where a tap point from each array is selectively coupled to the trim adjustment circuit for adjusting the overall gain. The first and second gain setting circuits can be matched to one another, with the addition of a gain offset circuit that is configured to skew the nominal gain values between the first and second gain setting circuits.

Overview

Monolithic amplifiers are often used in applications that require precision signal gain. These amplifiers routinely employ resistive feedback voltage divider elements, such as thin film resistors to control the overall signal gain. Although steps are taken to get accurate feedback ratios, resistor mismatches can result in significant overall amplifier gain error. Examples of conditions that disturb resistor ratios include both processing related differences as well as operating condition related differences. Example processing differences include processing gradients and variations in: sheet resistance (sheet rho), doping concentrations, parasitic capacitances, parasitic resistances, parasitic inductances, and parasitic leakages, to name a few. Example operating condition related differences include: temperature differences between resistors (thermal gradients), and operating voltage differences between resistors (voltage coefficient effects), to name a few.

Continuous laser trim of thin film resistance has been used in the past to correct for gain errors resulting from resistor mismatches. However, a variety of manufacturing costs such as test time, test equipment, laser trimming equipment, and other manufacturing costs can make such trimming techniques cost prohibitive for many markets. The process of trimming micro-electronic circuits (ICs) can also result in disturbances in the circuits that limit the accuracy of trimming, or extend the times necessary to perform trimming (again increasing costs).

Other manufacturing stresses can occur that reduce the accuracy of trimming. Laser trimming is typically performed on a semiconductor wafer prior to dicing the wafer into pieces called die. Example semiconductor processing steps include, dicing the wafer, attaching the die in a package with an epoxy, or perhaps a eutectic attachment, bonding the pads on the die to a lead-frame, forming and sealing the package, as well as others. Each of these semiconductor processing steps can produce die stresses (e.g., surface tension, sheering, bending, micro-cracking, etc.) that can change the overall values of the feedback elements and therefore directly affect post wafer trim gain accuracy.

The present disclosure contemplates each of the above described problems, as well as others, and provides a means for trimming the amplifier gain with a digital control signal to allow quick gain testing at wafer level. Moreover, a digital means for adjusting the gain can also be provided. The application of digital gain adjustment and digital trimming of gain increases the number of opportunities for accurate signal amplification, including in-circuit calibration methods.

Trimmed Gain Amplifier

FIG. 1 is a schematic of an example programmable gain amplifier circuit (100) that is arranged according to at least one aspect of the present disclosure. Programmable gain amplifier 100 includes an operational amplifier (AMP1), a first gain setting feedback circuit (GS1), a second gain setting feedback circuit (GS2), and a gain trimming adjustment circuit (TADJ).

The operational amplifier includes a non-inverting input terminal (INP), an inverting input terminal (INM), and an output terminal (AOUT). The first gain setting feedback circuit is coupled between AOUT and a circuit ground. The second gain setting feedback circuit is also coupled between AOUT and the circuit ground. The circuit ground can be any appropriate voltage such as, for example, VDD, VSS, (VDD−VSS)/2, 0V, GND, etc. The trimming adjustment circuit (TADJ) is arranged to couple a feedback point (FB) from the inverting input terminal (INM) to at least one of the two gain setting feedback circuits (GS1 and GS2), operating in a manner that is similar to a center wiper on a potentiometer (e.g., RP).

The first gain setting feedback circuit (GS1) includes at least two gain setting circuit components that are arranged to operate similar to two resistors (e.g., RA1, RF2). The second gain setting feedback circuit (GS2) also includes at least two gain setting circuit components that are also arranged to operate similar to two resistors (e.g., RA2, RF2). When the trimming circuit (TADJ) is controlled such that the first gain setting feedback circuit (GS1) is dominant, the gain is determined by the following equation: OUT=IN*(1+RF1/RA1). Similarly, the trimming circuit (TADJ) can be controlled to select the gain setting from the second gain setting feedback circuit (GS2) such that: OUT=IN*(1+RF2/RA2). The trimming circuit can be digitally adjusted (e.g., by signal DCTL) such that the gain can vary over a predetermined gain setting range such that OUT=IN*[a*(1+RF1/RA1)+b*(1+RF2/RA2)], where a is associated with the percentage gain determined by gain setting feedback circuit GS1, b is associated with the percentage gain determined by gain setting feedback circuit GS2, and (a+b)=1.

In practice, it is not very useful to have identical gain selection circuits for circuits GS1 and GS2. Instead, the gain selection circuits are intentionally mismatched to provide an adjustable range between desired gain settings. For example, for a non-inverting gain amplifier configuration with a desired gain of precisely two (2), it may be known that non-ideal effects provide a range of variations in resistance and other characteristics such that a gain of two is only achievable within 5% accuracy. Gain setting feedback circuit GSI can be arranged to provide a gain of 1.9, while gain setting feedback circuit GS2 can be arranged to provide a gain of 2.1. The trimming adjustment circuit (TADJ) can be configured to provide a range of variability between 1.9 and 2.1 in any number of step increments such that the gain can be digitally trimmed. The trimming between gain settings can be further understood after review of the various adjustable trim circuits described below.

Digitally Trim Circuit for Gain Amplifier

Figure 2:
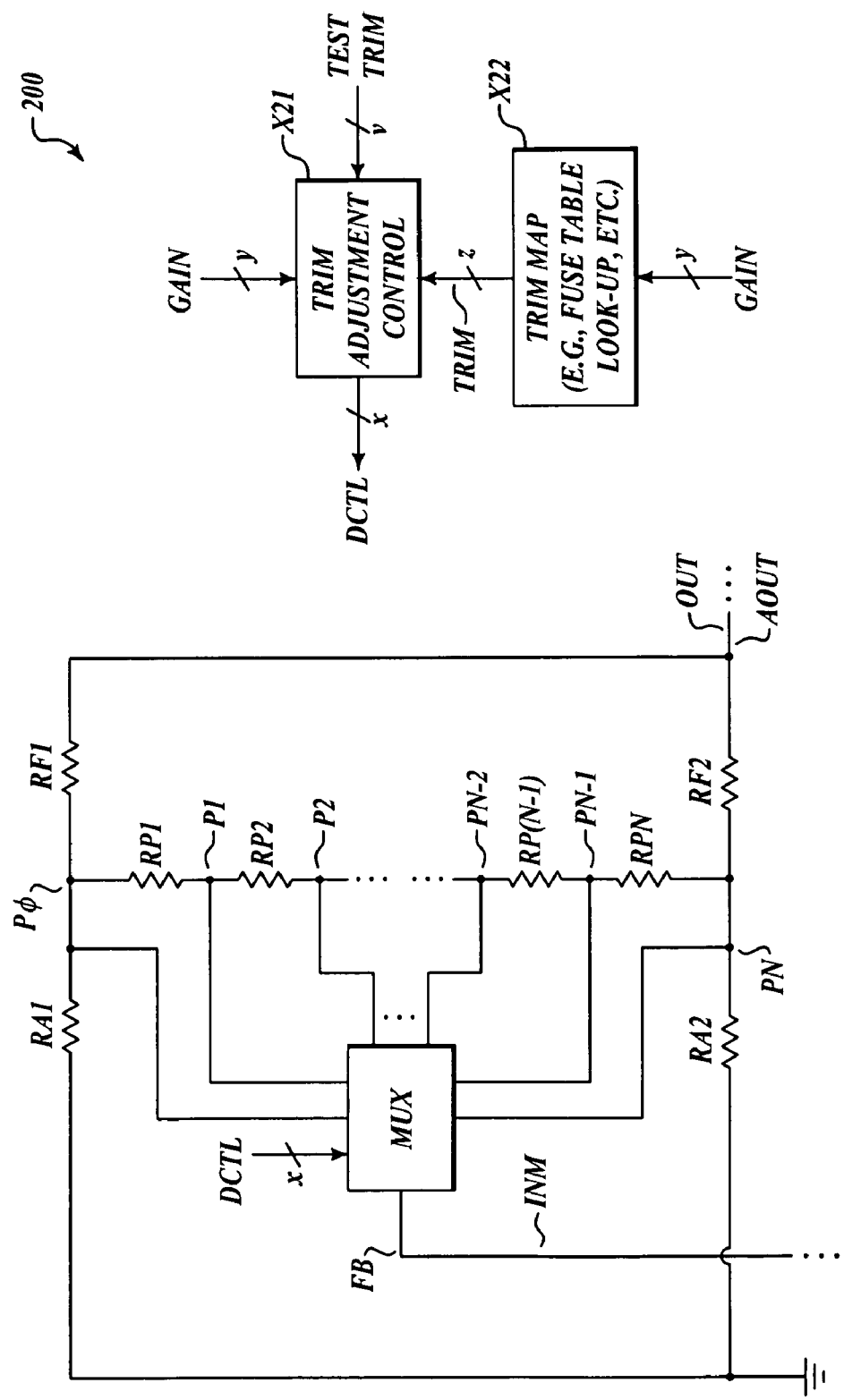
FIG. 2 is a schematic of an example adjustable trim circuit for a programmable gain amplifier circuit that is arranged according to at least one aspect of the present disclosure.

FIG. 2 is a schematic of an example adjustable trim circuit (200) for a programmable gain amplifier circuit that is arranged according to at least one aspect of the present disclosure. The adjustable trim circuit (200) includes a digitally controlled multiplexer (MUX), a tapped resistor circuit (RP1-RPN), a trim adjustment control circuit (X21) and a fuse map or look-up table (X22).

The first and second gain setting feedback circuits GS1 and GS2 from FIG. 1 are illustrated by resistor circuits RA1, RF1 and RA2, RF2, respectively. The junction between resistor RA1 and RF1 corresponds to a feedback point from the first gain setting feedback circuit (GS1), and is designated as point P0. The junction between resistor circuit RA2 and RF2 corresponds to a feedback point from the second gain setting feedback circuit (GS2), and is designated as point PN.

Tapped resistor circuit RP1-RPN is a series coupled resistor circuit that includes "N" resistor segments designated as RP1, RP2, . . . RP(N−1), RPN. One end of the series coupled resistor circuit corresponds to point P0, while the other end of the resistor circuit corresponds to point PN. Points P1 through P(N−1) corresponds to the common nodes between two adjacent segments in the series circuit. For example, point P1 is between resistor segments RP1 and RP2, while point P(N−1) is between resistor segments RPN and RP(N−1).

The multiplexer is arranged to couple one of the tap points (P0 through PN) to the feedback point (FB) at the inverting input (INM) of the operational amplifier in response to a digital control signal (DCTL), which may be a number (x) of bits wide. Resistor segments RP1-RPN are arranged to cooperate with MUX to operate as a digitally controlled potentiometer such as RP that is shown in FIG. 1. The wiper portion of the potentiometer corresponds to the output of the MUX, while points P0 and PN correspond to the ends of the potentiometer element. In one example, each of the resistor segments are equally sized with respect to one another such that linear steps are observed between the settings. In another example, the resistor segments are not equally sized such that non-linear steps can be observed between the settings (e.g., logarithmic, squared, cubed, square-rooted, etc.).

The trim adjustment control circuit (X21) is arranged to provide the digital control signal (DCTL) in response to a gain setting (GAIN), where the gain setting can be a number (y) of bits wide. A fuse map, or look-up table (X22) can also be employed to store a mapping of the appropriate gain trimming based on a particular gain setting (GAIN). Although the gain setting feedback circuits are illustrated simply as static resistor values RA1, RF1, RA2, and RF2, these are merely provided for simplicity.

As will be described later with respect to FIG. 7, a range of gain settings that are also responsive to the gain setting signal (GAIN) may also available. In one example gain setting (e.g., GAIN1), tap-point P1 may be the best trimmed gain setting. In another example gain setting (e.g., GAIN2), tap-point P(N−2) may be the best trimmed gain setting. The fuse map or look-up table (X22) is arranged to cooperate with the trim adjustment control such that the digital control of MUX corresponds to the optimum trimmed gain value for each corresponding gain setting (GAIN).

A test trim signal (TestTrim) can also be provided to the trim adjustment control circuit (X21), and can have any number of necessary control bits (e.g., v-bits). This TestTrim signal can be used in a test mode, or some other mode such as a trim mode. In one example, the TestTrim signal is used by the trim adjustment control (X21) in a test mode to override the trim settings (e.g., ignoring the trim map). In another example, the TestTrim signal(s) can be used to program the trim map in a program mode. In still another example, the TestTrim signal can be used to adjust the gain trim in conjunction with the trim map settings. Moreover, the TestTrim, Gain, and Trim setting signals can be used, separately or together, to adjust the overall gain trim of the amplifier or as part of a system level gain trim when the gain amplifier is part of a larger electronic system.

Digitally Controlled Trim Circuits

Figure 3:
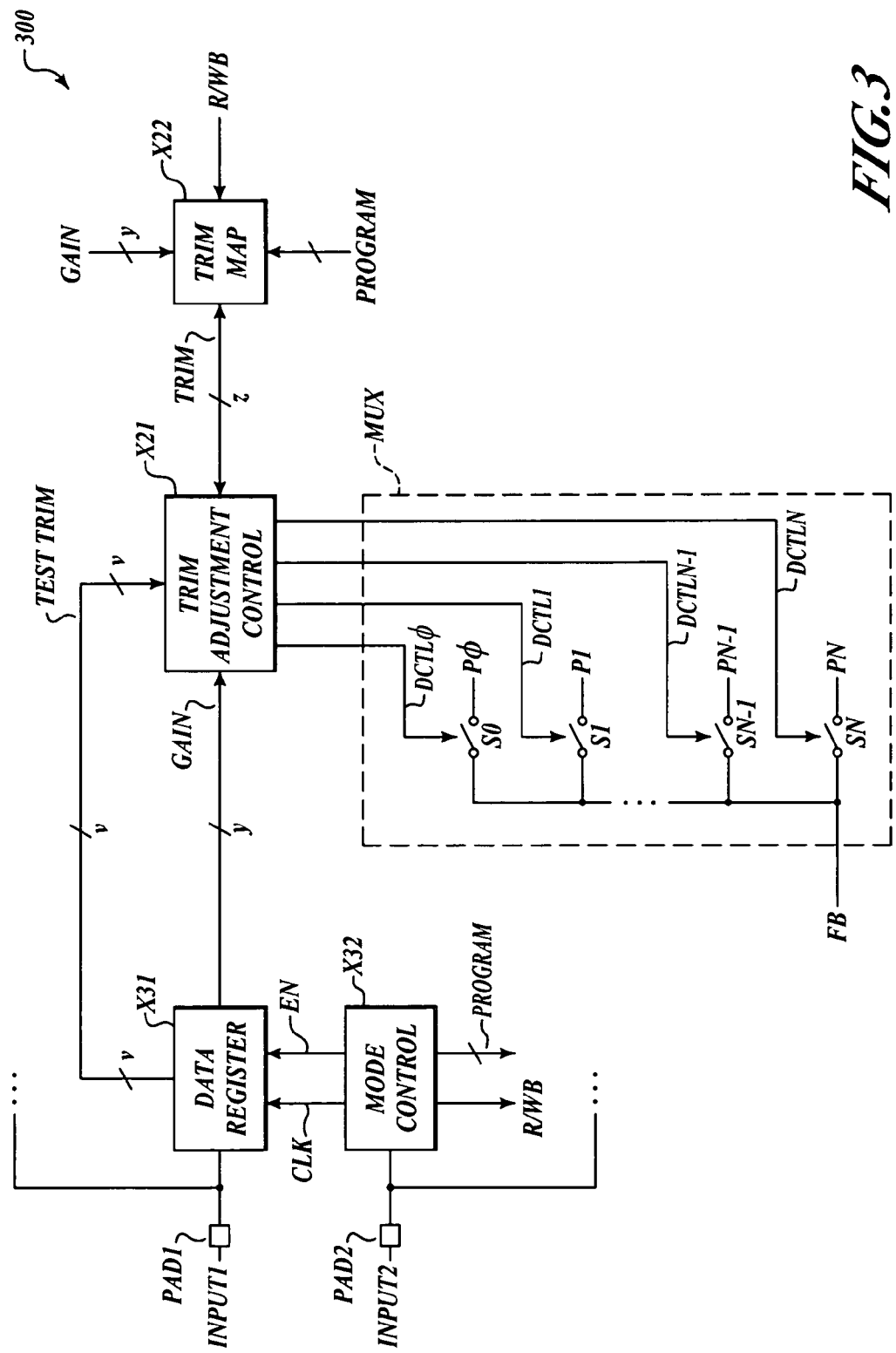
FIG. 3 is a schematic of an example digitally controlled trim circuit for adjusting a trim in a programmable gain amplifier circuit that is arranged according to at least one aspect of the present disclosure.

FIG. 3 is a schematic of an example digitally controlled trim circuit (300) for adjusting a trim in a programmable gain amplifier circuit that is arranged according to at least one aspect of the present disclosure. The digitally controlled trim circuit (300) includes a trim adjustment control circuit (X21), a trim map circuit (X22), a data register circuit (X31), and a mode control circuit (X32).

The multiplexer circuit (MUX) from FIG. 2 is replaced with a set of switching circuits (S0 through SN). Each of the switching circuit is coupled between the feedback point (FB) and a respective one of the tap points (P0 through PN) from the tapped resistor circuit (see e.g., FIG. 2). Each of the switching circuits is also responsive to one of the control signals (DCTL0-DCTLN) from the trim adjustment control circuit (X31). For example, switching circuit S0 is coupled between point P0 and FB, and responsive to signal DCTL0, while switching circuit S1 is coupled between point P1 and FB and responsive to signal DCTL1. Although the multiplexer circuit (MUX) is illustrated as parallel switching circuits, other switching circuits can be employed to provide a desired decoding logic with the trim adjustment control circuit.

The trimming adjustment control circuit (X21) is arranged to receive a gain setting (GAIN) from a data register circuit (X31), where the gain setting (GAIN) signal can be a y-bit digital signal. The trimming adjustment control circuit (X21) is also arranged to receive a trim setting (TRIM) from a trim map circuit (X22), wherein the trim setting (TRIM) can be a z-bit digital signal. The trim adjustment control circuit (X21) is arranged to provide digital control signals (e.g., DCTL0-DCTLN) in response to the gain setting (GAIN) and trim setting (TRIM).

The data register circuit (X31) is arranged to receive an input signal (e.g., INPUT1) from a pad (e.g., PAD1), when enabled, to capture a serial stream of data and provide a gain setting (GAIN) in a parallel format of y-bits. The data register (X31) may be arranged to time-slice the incoming input signal (INPUT) with a clock signal (CLK) to latch the serial stream of data for the gain setting (GAIN). The data register (X31) may also be disabled (e.g., EN=0) such that the serializer will not interfere with operation of the gain amplifier until the programming mode (or some other mode is again selected. In this way, the pad (PAD1) may be used for some other purpose with other circuits (not shown) unless the programming mode is selected. The data register circuit (X31) can also be arranged to receive an input signal when so enabled to capture a serial stream of data and provide a test trim signal (TestTrim) similar to that previously described for FIG. 2. The TestTrim signal is coupled to the trim adjustment control circuit (X21), and can be used in any number of operating modes such as test, program, etc. The TestTrim, Gain, and Trim setting signals can again be used, separately or together, to adjust the overall gain trim of the amplifier or as part of a system level gain trim when the gain amplifier is part of a larger electronic system. In an alternative embodiment, the data register may be eliminated and the trim adjustments are accomplished by some other circuit, or perhaps with wafer probing.

The mode control circuit (X32) is arranged to control the functions of the data register circuit (X31) and the trim map circuit (X22) by detecting any one of a set of operating modes. The mode control circuit can also be used to generate clocks (e.g., CLK), read/write signals (e.g., R/WB), enable signals (e.g., EN) as well as others. In one example, the mode control circuit is arranged to detect an input signal (e.g., INPUT2) from an input PAD (e.g., PAD2) to identify that the test mode is enabled. In another example, the mode control circuit is arranged to detect an input signal (e.g., INPUT2) from the input pad (e.g., PAD2) to identify that the program mode is enabled. In still another example, the mode control circuit is arranged to detect an input signal (e.g., INPUT2) from the input pad (e.g., PAD2) to identify that the run mode is enabled. In still yet another example, the mode control circuit is arranged to detect an input signal (e.g., INPUT2) from the input pad (e.g., PAD2) to select a write or read mode for programming the trim map. Similar to the discussion for the data register, the mode control circuit can be arranged be disabled when not in use such that the pad (PAD2) can be used for some other purpose with other circuits (not shown).

Figure 4:
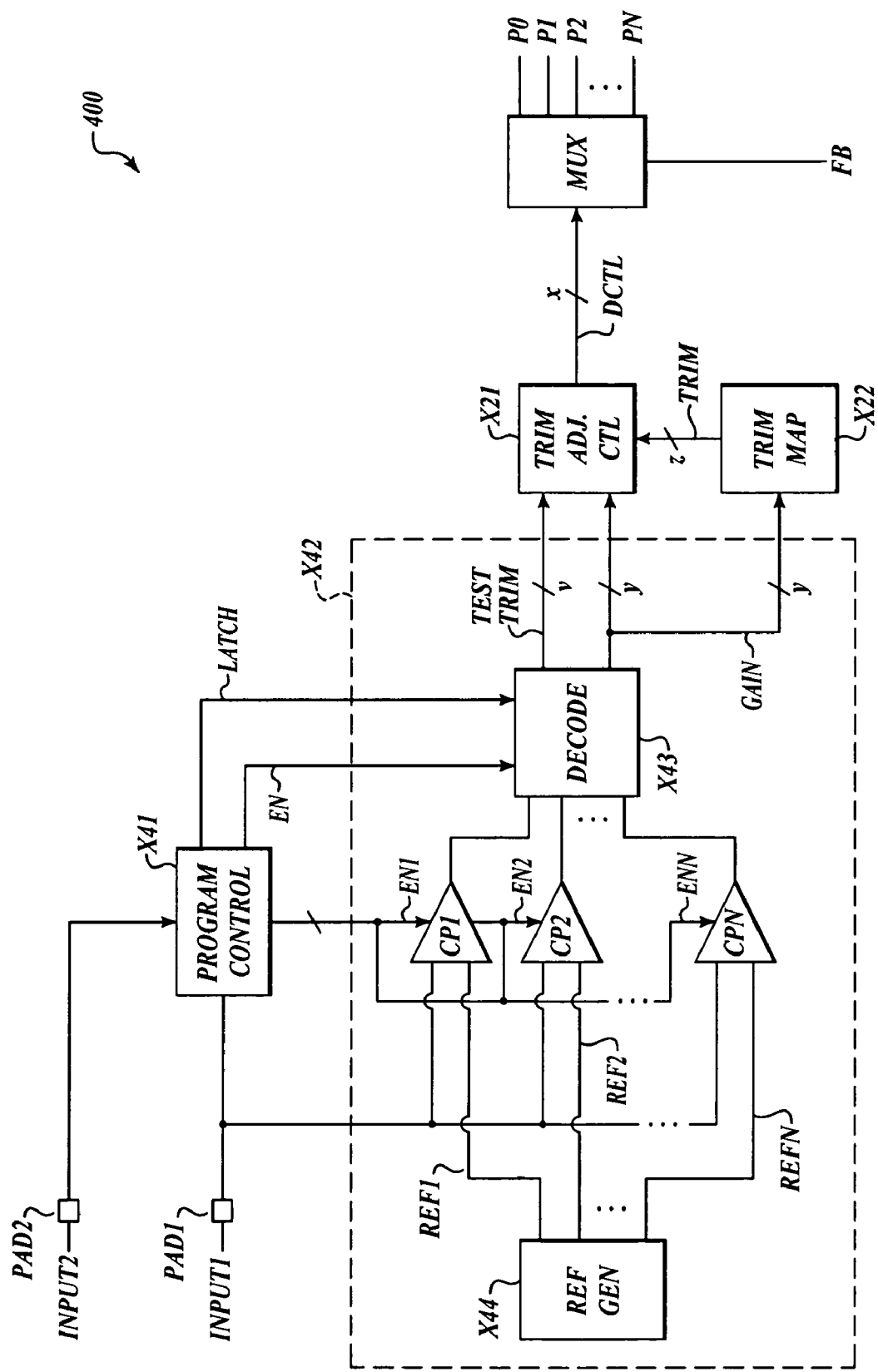
FIG. 4 is a schematic of another example digitally controlled trim circuit for adjusting a trim in a programmable gain amplifier circuit that is arranged according to at least one aspect of the present disclosure.

FIG. 4 is a schematic of another example digitally controlled trim circuit (400) for adjusting a trim in a programmable gain amplifier circuit that is arranged according to at least one aspect of the present disclosure. The digitally controlled trim circuit (400) includes a trim adjustment control circuit (X21), a trim map circuit (X22), a multiplexer circuit (MUX), a program control circuit (X41), and an analog-to-digital converter circuit (X42). The functions of the trim adjustment control circuit (X41) the trim map circuit (X22), and the multiplexer (MUX) are substantially the same as that previously described above.

The analog-to-digital converter circuit (X42) is arranged to decide the gain setting (GAIN) from an analog input signal (e.g., INPUT 1 from PAD1). In one example implementation, a flash style converter is arranged to use a bank of comparators (CP1-CPN) to compare the analog input signal to a series of reference signals (REF1-REFN), which are generated from a reference generator circuit (X44). A decoder logic circuit is used to evaluate the output of the comparators and latch the decoded gain setting (GAIN) when the program control circuit (X41) asserts a latch signal (LATCH). Additional functions such as mode control for test modes, programming modes, and other modes can also be provided in a similar fashion. Although illustrated as a flash-type analog-to-digital converter, other styles of converters are equally applicable.

The decoder logic circuit (X43) can also be arranged to decode a test trim signal (TestTrim) similar to that previously described for FIGS. 2-3. The TestTrim signal is again coupled to the trim adjustment control circuit (X21), and can be used in any number of operating modes such as test, program, etc. The TestTrim, Gain, and Trim setting signals can again be used, separately or together, to adjust the overall gain trim of the amplifier or as part of a system level gain trim when the gain amplifier is part of a larger electronic system.

Gain Skewing Circuits

Figure 5:
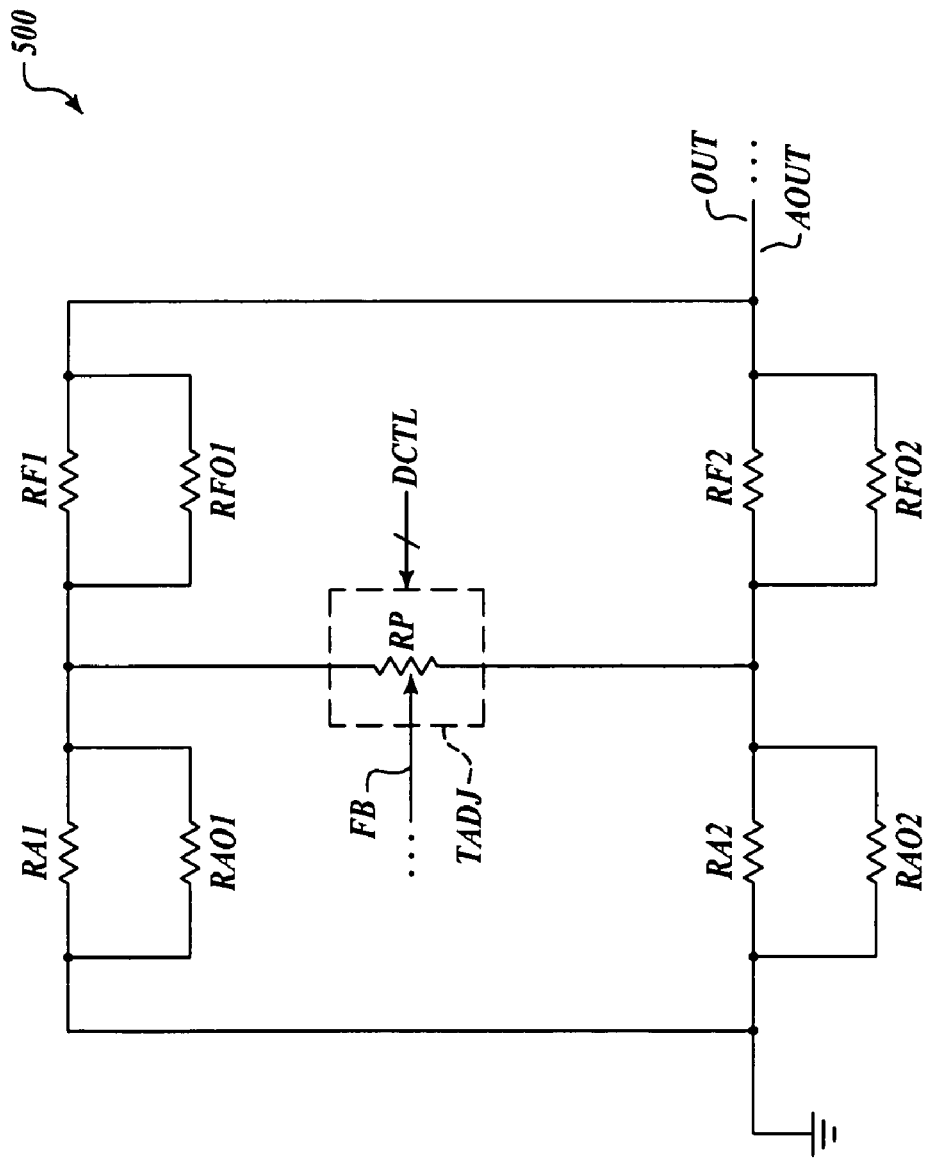
FIG. 5 is a schematic of an example gain skewing mechanism in a programmable gain amplifier circuit that is arranged according to at least one aspect of the present disclosure.

The approach described above with respect to FIGS. 1 through 4 presumes that the gain setting feedback networks have two different values of gain selection. In practice, it is desirable to have matched control over the gain setting such that the gain setting circuits track each other with processing variations and other non-ideal considerations, including system level variations. FIG. 5 is a schematic of an example gain skewing mechanism (500) in a programmable gain amplifier circuit that is arranged according to at least one aspect of the present disclosure.

Gain skewing mechanism 500 includes gain offset resistors RAO1, RFO1, RAO2 and RFO2. Gain offset resistor RAO1 is coupled in parallel with resistor RA1. Gain offset resistor RFO1 is coupled in parallel with resistor RF1. Gain offset resistor RAO2 is coupled in parallel with resistor RA2. Gain offset resistor RFO2 is coupled in parallel with resistor RF2.

Resistor RA1 is matched to resistor RA2, while resistor RF1 is matched to resistor RF2. Thus, without the gain offset resistors, the gain setting feedback circuits are substantially identical to one another. However, the gain offset resistors are specifically designed to create a difference in the gain between the first and second gain setting feedback circuits.

In one example, when resistors RA1 and RA2 have nominal values of 1K ohms, and resistors RF1 and RF2 have nominal values of 1K, the overall gain of resulting circuit is nominally a gain of two (2). Assuming resistor circuit RAO1 has a value of 20K, the effective resistance of the parallel combination of RA1 and RAO1 is approximately 950 ohms, with a resulting gain of 2.05 instead of 2.0. Similarly, a resistance of 20K for resistor RFO2 gives a nominal effective resistance of 950 ohms for the parallel combination of RF2 and RFO2, decreasing the overall gain from 2.0 to 1.95. For one example gain adjustment design, the described gain skewing mechanism scan be arranged to provide an adjustable gain ranging from 1.95 to 2.05, where the adjustment between the two gain setting is accomplished by the digitally controlled potentiometer/trim circuit.

As illustrated above, not every one of the gain offset resistors need be employed in a specific implementation of gain skewing. One or more of the gain offset resistors can be arranged to provide the desired range of gain selection using the above described techniques. The two feedback paths to the amplifier's input are then controlled in a way to continuously select between 'Gain Boost' and 'Gain Cut' feedback paths. The gain trim implementations previously described illustrate a multi-tap resistor array that is configured to operate as a digitally selectable resistive potentiometer.

Figure 6:
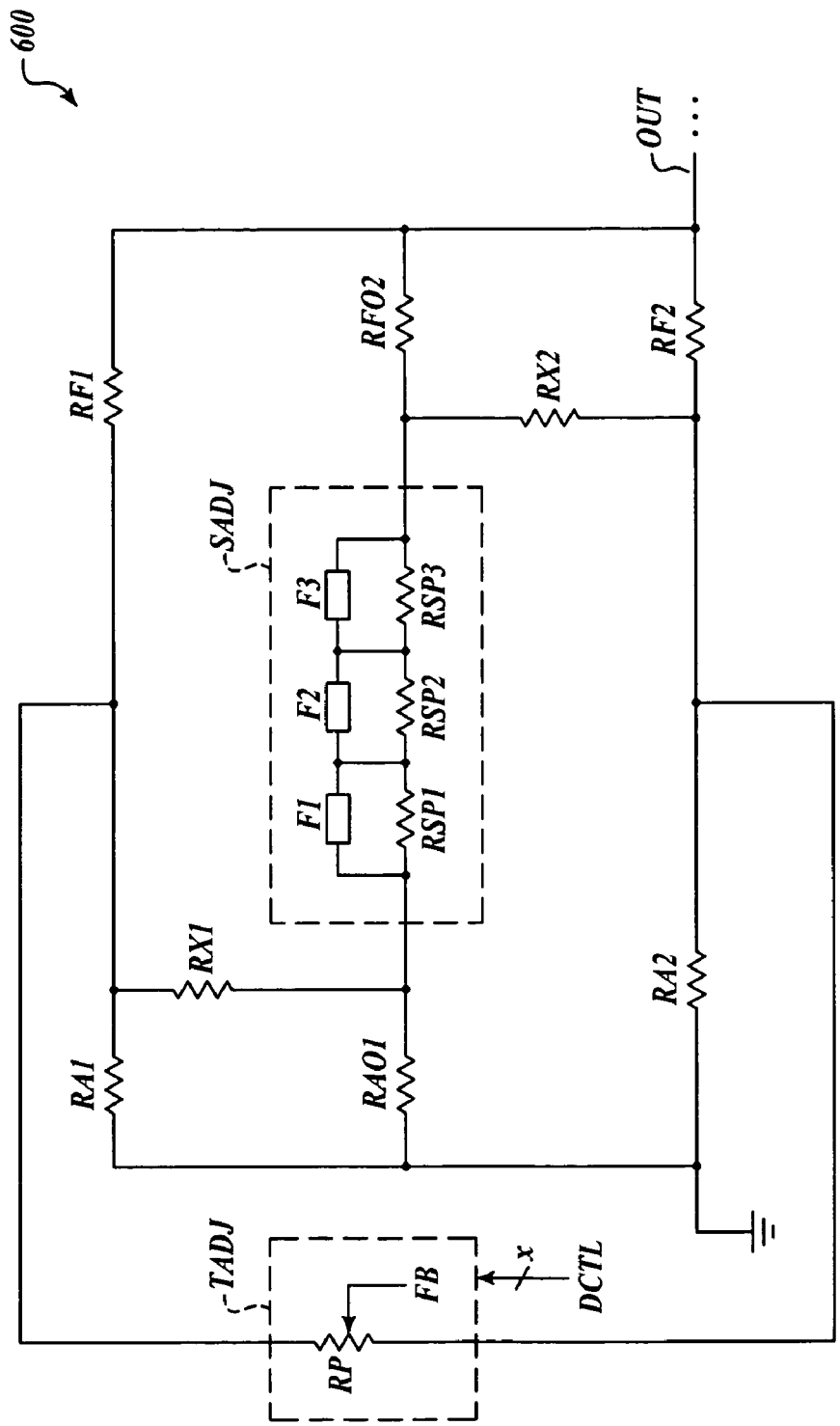
FIG. 6 is a schematic of an example gain skewing mechanism that includes a span adjustment for a programmable gain amplifier circuit that is arranged according to at least one aspect of the present disclosure.

FIG. 6 is a schematic of an example gain skewing mechanism that includes a span adjustment for a programmable gain amplifier circuit that is arranged according to at least one aspect of the present disclosure. The gain skewing mechanism includes resistors RAO1, RX1, RFO2, RX2, and a span adjustment circuit (SADJ).

The overall operation of circuit 600 in a gain amplifier configuration is the same as that previously described for FIGS. 1-5. The first gain setting feedback circuit is illustrated as resistors RA1 and RF2, while the second gain setting feedback circuit is illustrated as resistors RF2 and RA2. Also, trimming circuit (TADJ) is again illustrated as a digitally controlled potentiometer. For this example circuit resistor RA1 is matched to resistor RA2, and resistor RF1 is matched to resistor RF2.

Similar to circuit 500, gain offset resistors RAO1 and RFO2 are provided. However, resistor RAO1 is coupled through resistor RX1 to resistor RA1, and resistor RFO2 is coupled through resistor RX2 to resistor RF2. Assuming that the span adjustment circuit (SADJ) is effectively an open circuit, it can be observed that the series combination of RX1 and RAO1 is arranged to provide a gain skewing adjustment for resistor RA1, while the series combination of RX2 and RFO2 is arranged to provide a gain skewing adjustment for RF2.

The span adjustment circuit (SADJ) has a finite resistance that is determined by a series array of selectable resistances. In one example, there are three resistor segments (RSP1-RSP3), where each of the resistor segments is selected or shorted out by a respective fuse link (e.g., F1-F3). The resistance between the terminals of the span adjustment circuit is adjusted by the fusing (or anti-fusing) technology to select a span between the gain setting adjustments. The fuse links can be blown in a number of ways including both pre-packaging and post packaging processes. In one example, the fuse links are blown using a laser prior to packaging. In another example, the fuse links are blown using a high current that is injected into the circuit using a wafer probe circuit prior to packaging. In still another example, the fuse links are blown using a special fuse selector circuit that is arranged to break the fuse links in a packaged part. Although described within the context of fuse links, anti-fuse link technologies are also contemplated.

In one example, resistors RX1 and RX2 each have a nominal resistance of 100K ohms, and the total resistance of RA1 and RF1 is on the order of 5K ohms. For this example, the gain offset adjustments are determined by the values of resistors RAO1, RFO2 and the span adjustment circuit (SADJ). The span adjustment circuit (SADJ) varies the range of the gain trimming adjustment. In other words, the overall range of values in the gain setting that can be selected by the trim adjustment circuit (TADJ) will be limited by the selected value in the span adjustment circuit (SADJ).

Although the span adjustment circuit (SADJ) illustrates a series of fuse links, the overall effect of selectively shorting out resistor segments can be accomplished in a number of ways. In one example, the fuse links are replaced with anti-fuse links. In another example, the fuse links are replaced with floating gate transistor devices that can be programmed as short-circuited or open-circuited. In another example, the fuse links are replaced by transistor switching circuits that are programmable. Other examples are also considered within the scope of the present disclosure.

Gain Selection Circuits

Figure 7:
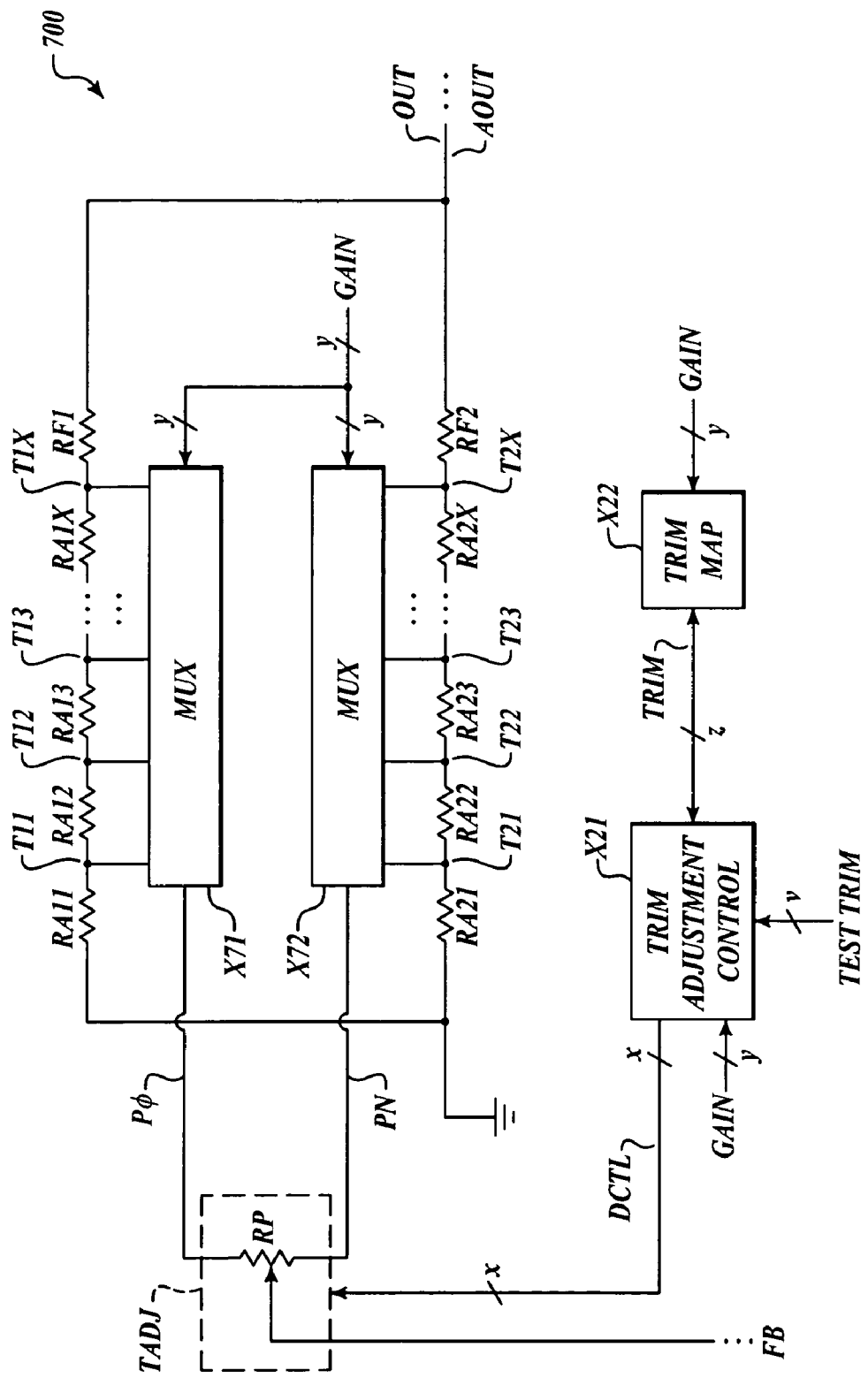
FIG. 7 is a schematic of an example gain selection mechanism in a programmable gain amplifier circuit that is arranged according to at least one aspect of the present disclosure.

FIG. 7 is a schematic of an example gain selection mechanism (700) in a programmable gain amplifier circuit that is arranged according to at least one aspect of the present disclosure. As illustrated in FIGS. 1 and 2, the programmable gain amplifier circuit has two gain settings that are determined by two gain selection circuits (GS1 and GS2). The gain setting feedback circuits from FIGS. 1 and 2 are replaced with selectable tapped resistor arrays as illustrated in FIG. 7.

The gain associated with the first gain setting feedback circuit is determined by resistor RF1 and a first tapped resistor array consisting of series coupled resistors RA11-RA1X. Resistor RA11 is coupled between the circuit ground and node T11. Resistor RA12 is coupled between node T11 and T12. Resistor RA13 is coupled between node T12 and T13. Resistor RA1X is coupled between node T1(X−1) and node T1X. Resistor RF1 is coupled between node T1X and node AOUT. Nodes T11-T1X are each coupled to a gain selection multiplexer circuit (X71), which is arranged to couple a selected one of nodes T11-T1X to node P0 in response to the gain selection signal (GAIN).

The gain associated with the second gain setting feedback circuit is determined by resistor RF2 and a second tapped resistor array consisting of series coupled resistors RA21-RA2X. Resistor RA21 is coupled between the circuit ground and node T21. Resistor RA22 is coupled between node T21 and T22. Resistor RA23 is coupled between node T22 and T23. Resistor RA2X is coupled between node T2(X−1) and node T2X. Resistor RF2 is coupled between node T2X and node AOUT. Nodes T21-T2X are each coupled to a gain selection multiplexer circuit (X72), which is arranged to couple a selected one of nodes T21-T2X to node PN in response to the gain selection signal (GAIN).

The trim adjustment circuit (TADJ) is coupled between nodes P0 and PN, similar to that described previously with respect to FIGS. 1 and 2, where the control of the trimming adjustment is accomplished by a digital control signal DCTL. The digital control signal can be generated by any means, such as the trim adjustment control circuit (X22) and a trim map circuit (X22), as previously described.

In operation, the gain selection multiplexers X71 and X72 are operated such that the selection of an increase in the overall gain from the first gain selection circuit is accompanied by a corresponding increase in the overall gain from the second gain selection circuit. Similarly, a selection of a decrease in the overall gain from the first gain selection circuit is accompanied by a corresponding decrease in the overall gain from the second gain selection circuit.

The trim adjustment circuit (TADJ) is arranged select the appropriate trim setting also based on the gain setting as previously discussed. The trim setting corresponds to an appropriate "blend" of the gain settings from the first gain setting feedback circuit and the second gain setting circuit, where each gain setting may result in a different "blend". In other words, the expression for the overall gain of the circuit is given by: GAIN=[a*(1+RF1$eff$/RA1$eff$)+b*(1+RF2$eff$/RA2$eff$)], where: RF1$eff$ and RA1$eff$ are determined by the selected one of nodes T11-T1X via MUX X71, RF2$eff$ and RA2$eff$ are determined by the selected one of nodes T21-T2X via MUX X72, and the "a" and "b" coefficients are determined by the trim adjustment circuit's "blend" factor.

The trim adjustment control circuit (X21) can again be arranged to receive a test trim signal (TestTrim) similar to that previously described for FIGS. 2-4. The TestTrim signal is again arranged for use in any number of operating modes such as test, program, etc. The TestTrim, Gain, and Trim setting signals can again be used, separately or together, to adjust the overall gain trim of the amplifier or as part of a system level gain trim when the gain amplifier is part of a larger electronic system.

Each of the figures described can be combined to provide a desired functionality. In one example, the circuits of FIGS. 1, 2 and 5 can be combined to provide for a programmable gain amplifier, with digitally controlled trim adjustment, with matched-style gain offset adjustment. In another example, the circuits of FIGS. 1, 2 and 6 can be combined to provide for a programmable gain amplifier, with digitally controlled trim adjustment, with matched-style gain offset adjustment and selectable span adjustment. In still another example, the circuits of FIGS. 1, 2 and 7 can be combined to provide for a programmable gain amplifier with digitally controlled trim adjustment and digitally controlled gain adjustment. In yet another example, the circuits of FIGS. 1, 2, 5 and 7 can be combined to provide for a programmable gain amplifier with digitally controlled trim adjustment, digitally controlled gain adjustment, and matched-style gain offset adjustment. In still yet another example, the circuits of FIGS. 1, 2, 6 and 7 can be combined to provide for a programmable gain amplifier with digitally controlled trim adjustment, digitally controlled gain adjustment, and matched-style gain offset adjustment with selectable span adjustment. Additional examples are also contemplated to provide any number of possibilities, including additional mode control circuits, serial control signals, parallel control signals, internally accessed trim tables, externally accessed trim tables, to name a few.

Gain Selection/Trimming Flow

Figure 8:
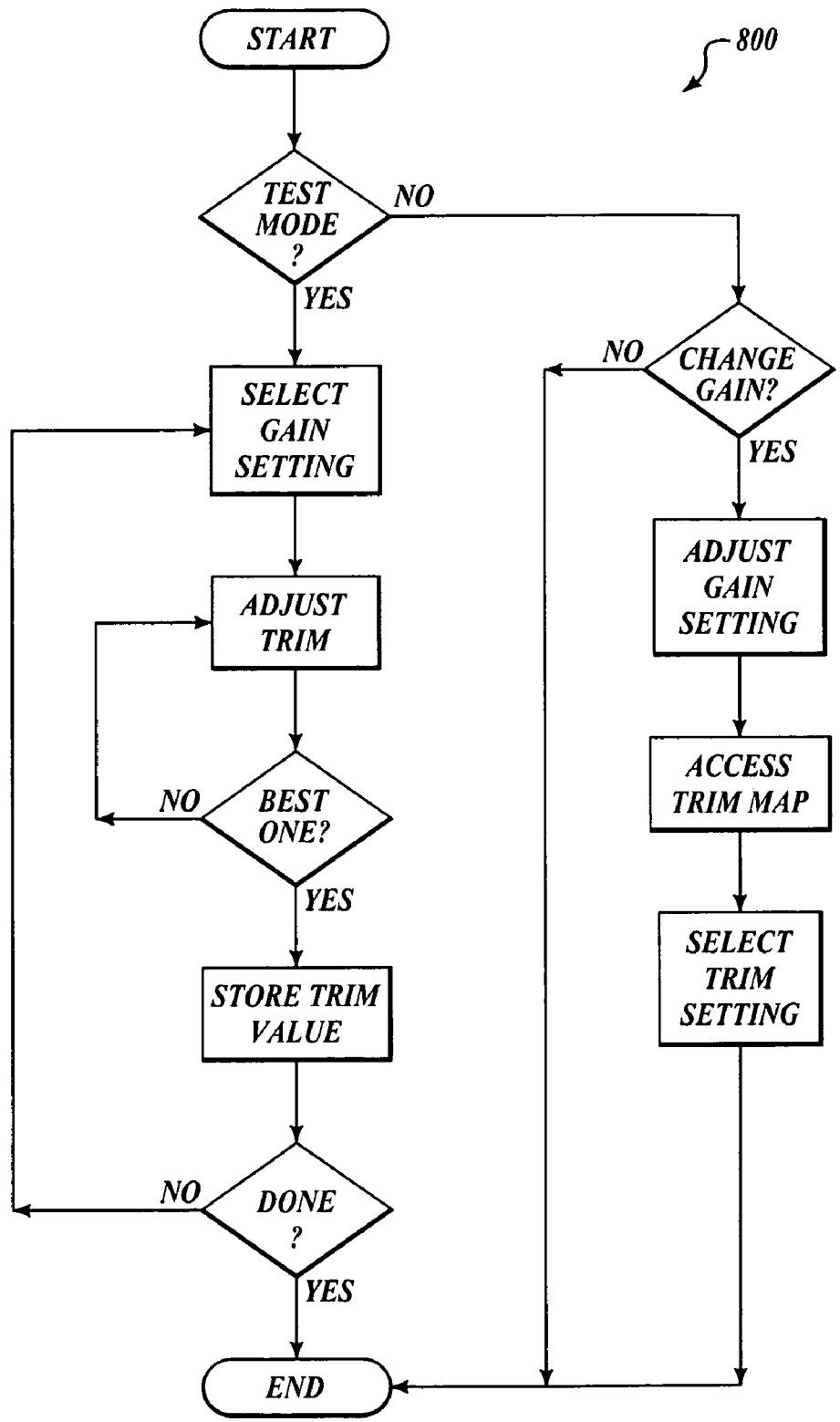
FIG. 8 is a flow chart for testing and/or adjusting gain selection and trimming in a programmable gain amplifier circuit that is arranged according to at least one aspect of the present disclosure.
Figure 9:
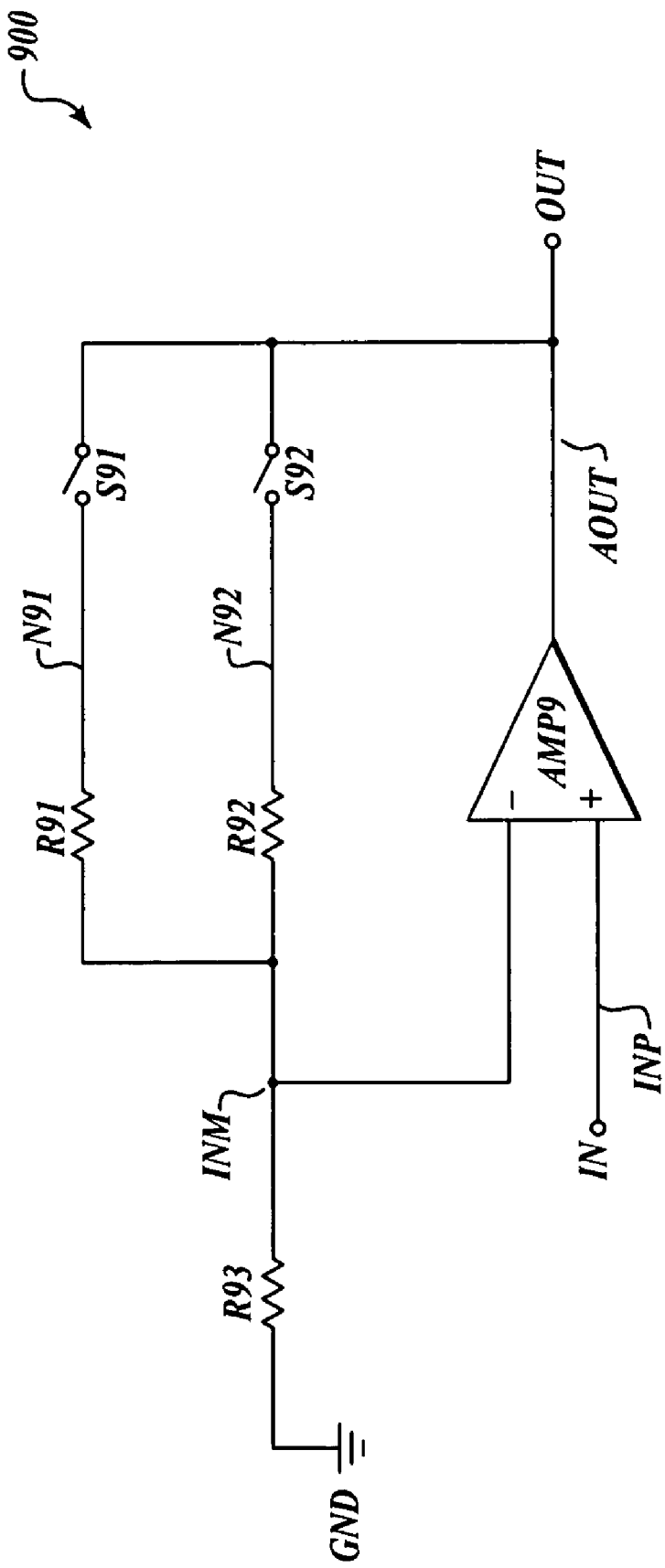
FIG. 9 is a schematic of a conventional programmable gain amplifier circuit.

FIG. 8 is a flow chart (800) for testing and/or adjusting gain selection and trimming in a programmable gain amplifier circuit that is arranged according to at least one aspect of the present disclosure. The programmable gain amplifier circuit corresponds to a circuit such as those described in FIGS. 1-7 above, as well as others that are similarly arranged.

For the purposes of the flow chart identified by FIG. 8, it is presumed that either the "test mode" is active or inactive. However, additional modes may be employed as will be described. The described system/circuit is arranged to evaluate the current operating mode. When the current operating mode corresponds to a test mode, the system cycles through each of the available gain settings (e.g., gain setting 1, gain setting 2, etc.) to test the accuracy of each gain setting. After a particular gain setting is selected, the system cycles through the available trim setting (e.g., trim setting 1, trim setting 2, etc.) to identify the closest match to the desired gain setting. The trim setting can be provided by any means such as through a TestTrim signal, a Trim signal (e.g., from a Trim Map), or any other reasonable means such as those previously described above. After the best available trim setting is identified, the value for the trim setting is stored. The system continues to cycle through the available gain settings until the best trim setting values for each of the gain settings are identified.

The identified "best" available trim settings can be stored as values in a trim map or look-up table (LUT) such as those previously described with respect FIGS. 2, 3, 4, and 7. The trim map can be implemented on the same die as the programmable gain amplifier (e.g., a fuse link table, a non-volatile memory array, or some mapping mechanism), on a separate die in a multi-chip module, or in a separate micro-electronic circuit that is arranged to communicate the look-up table information to the programmable gain amplifier.

When the system/circuit identifies that the current operating mode is a non-test mode, gain settings can be adjusted by accessing the previously generated trim map or in other implementations by retrieving an externally provided trim setting. For example, a command can be provided to the programmable gain amplifier circuit to change the gain setting from gain setting 1 to gain setting 2. In this instance, the circuits are arranged to adjust the gain setting in the programmable gain amplifier by selecting the appropriate setting in the gain setting feedback circuits (e.g., see FIG. 7). After the gain setting has been selected, the trim map (or other setting mechanism) is accessed using the gain setting as an index, and the trim setting is retrieved. The trim setting is selected (e.g., the trim adjustment circuit is instructed to change it's setting) and the gain settings from the first gain setting feedback circuit (e.g., GS1) and the second gain setting circuit (e.g., GS2) are "blended" according to the previously created trim map.

Although the above-described procedural flow discusses a test mode and a non-test mode, other operating modes are contemplated. In one example, the circuits are arranged to operate in an "adjust span mode", where the span such as in FIG. 6 can be adjusted while testing a range of gain settings. In another example, the circuits are operated in a "program gain/trim mode", where the trim map is loaded from a separate set of values that can be provided by an externally provided table (e.g., ROM, EPROM, EEPROM, LUT, NVM, etc.). In another example, the circuits are operated in a "run mode", where the gain and trim settings cannot be changed. In still another example the circuits are operated in a "program gain mode", where the trim map and gain settings are selected to adjust the trim setting and amplifier gain similar to that described for FIG. 8. Other modes are also contemplated and considered within the scope of the present disclosure.

Although the invention has been described herein by way of exemplary embodiments, variations in the structures and methods described herein may be made without departing from the spirit and scope of the invention. For example, the positioning of the various components may be varied. Individual components and arrangements of components may be substituted as known to the art. Since many embodiments of the invention can be made without departing from the spirit and scope of the invention, the invention is not limited except as by the appended claims.

What is claimed is:

1. A programmable gain amplifier circuit, comprising:
   a differential amplifier that includes an inverting input terminal, a non-inverting input terminal, and an output terminal, wherein the inverting input terminal is coupled to a feedback node, the non-inverting input is arranged to receive an input signal, and wherein the output terminal is coupled to an output node;
   a first gain setting feedback circuit that includes a first terminal that is coupled to the output node, a second terminal that is coupled to a first intermediate node, and a third terminal that is coupled to a circuit ground, wherein the first gain setting feedback circuit has an associated first gain value (G1);
   a second gain setting feedback circuit that includes a first terminal that is coupled to the output node, a second terminal that is coupled to a second intermediate node, and a third terminal that is coupled to the circuit ground, wherein the second gain setting feedback circuit has an associated second gain value (G2) that is different from and independent from the first gain value (G1); and
   a trim adjustment circuit that includes a first terminal that is coupled to the first intermediate node, a second terminal that is coupled to the second intermediate node, and a third terminal that is coupled to the feedback node, wherein the trim adjustment circuit is arranged to adjust a gain trim associated with the programmable gain amplifier in response to a multi-bit digital control signal (DCTL) such that a gain factor associated with the programmable gain amplifier is a blend of the first gain value (G1) and the second gain value (G2), wherein the blend is adjustable controlled in response to a multi-bit digital control signal (DCTL).

2. The programmable gain amplifier circuit of claim 1, wherein the first gain setting feedback circuit comprises: a first resistor circuit (RF1) that is coupled between the output node and the first intermediate node, and a second resistor circuit (RA1) that is coupled between the first intermediate node and the circuit ground, and wherein the second gain setting feedback circuit comprises: a third resistor circuit (RF2) that is coupled between the output node and the second intermediate node, a fourth resistor circuit (RA2) that is coupled between the second intermediate node and the circuit ground, wherein the first gain value (G1) is determined from a ratio of the first resistor circuit (RF1) and the second resistor circuit (RA1) so that G1=[1+(RF1/RA1)], and wherein the second gain value (G2) is determined from a ratio of the third resistor circuit (RF2) and the second resistor circuit (RA2) so that G2=[(1+(RF2/RA2)].

3. The programmable gain amplifier circuit of claim 2, wherein the first resistor circuit (RF1) and the third resistor circuit (RF2) have substantially equal associated resistance values, and wherein the second resistor circuit (RA1) and the fourth resistor circuit (RA2) have substantially equal associated resistance values.

4. The programmable gain amplifier circuit of claim 2, wherein the first resistor circuit (RF1) and the third resistor circuit (RF2) have substantially different associated resistance values, and wherein the second resistor circuit (RA1) and the fourth resistor circuit (RA2) have substantially different associated resistance values.

5. A programmable gain amplifier circuit comprising:
   a differential amplifier that includes an inverting input terminal, a non-inverting input terminal, and an output terminal, wherein the inverting input terminal is coupled to a feedback node, the non-inverting input is arranged to receive an input signal, and wherein the output terminal is coupled to an output node;
   a first gain setting feedback circuit that includes a first terminal that is coupled to a the output node, a second terminal that is coupled to a first intermediate node, and a third terminal that is coupled to a circuit ground, wherein the first gain setting feedback circuit has an associated first gain value (G1), wherein the first gain setting feedback circuit comprises: a first resistor circuit (RF1) that is coupled between the output node and the first intermediate node, and a second resistor circuit (RA1) that is coupled between the first intermediate node and the circuit ground;

a second gain setting feedback circuit that includes a first terminal that is coupled to the output node, a second terminal that is coupled to a second intermediate node, and a third terminal that is coupled to the circuit ground, wherein the second gain setting feedback circuit has an associated second gain value (G2) that is different from the first gain value (G1), and wherein the second gain setting feedback circuit comprises: a third resistor circuit (RF2) that is coupled between the output node and the second intermediate node and a fourth resistor circuit (RA2) that is coupled between the second intermediate node and the circuit ground;

a trim adjustment circuit that includes a first terminal that is coupled to the first intermediate node, a second terminal that is coupled to the second intermediate node, and a third terminal that is coupled to the feedback node, wherein the trim adjustment circuit is arranged to adjust a gain trim associated with the programmable gain amplifier in response to a digital control signal (DCTL) such that a gain factor associated with the programmable gain amplifier is a blend of the first gain value (G1) and the second gain value (G2); and a gain skewing resistor circuit that is arranged in parallel with one of the first resistor circuit (RF1), the second resistor circuit (RA1), the third resistor circuit (RF2), and the fourth resistor circuit (RA2).

6. The programmable gain amplifier circuit of claim 5, the gain skewing resistor circuit further comprising: a first gain skewing resistor circuit (RFO1) that is arranged in parallel with the first resistor circuit (RF1), and a second gain skewing resistor circuit (RAO2) that is arranged in parallel with the fourth resistor circuit (RA2).

7. The programmable gain amplifier circuit of claim 5, the gain skewing resistor circuit further comprising: a first gain skewing resistor circuit (RFO2) that is arranged in parallel with the third resistor circuit (RF2), and a second gain skewing resistor circuit (RAO1) that is arranged in parallel with the second resistor circuit (RA1).

8. The programmable gain amplifier circuit of claim 5, further comprising: a first gain offset resistor circuit (RAO1) that is coupled between the circuit ground and a third intermediary node, a second gain offset resistor circuit (RFO2) that is coupled between the output node and a fourth intermediary node, a span adjustment circuit (SADJ) that is coupled between the third intermediary node and the fourth intermediary node, a first coupling resistor circuit (RX1) that is coupled between the first intermediary node and the third intermediary node, and a second coupling resistor circuit (RX2) that is coupled between the second intermediary node and the fourth intermediary node.

9. The programmable gain amplifier circuit of claim 8, wherein the span adjustment circuit (SADJ) comprises an series coupled array of selectable resistor segments that are selectable by at least one of: an array of fuse devices, an array of anti-fuse devices, an array of programmable short circuit links, an array of programmable fuse links, and an array of floating gate devices.

10. The programmable gain amplifier circuit of claim 1, wherein the first gain setting feedback network and the second gain setting feedback network are both arranged to select their gain settings in response to a gain select signal (GAIN) such that the first gain value increases with increasing values of the second gain value, and the first gain value decreases with decreasing values of the second gain value.

11. The programmable gain amplifier circuit of claim 1, wherein the first gain setting feedback network comprises a first array of series coupled resistor circuits that is arranged in cooperation with a first gain selection multiplexer to select the first gain value in response to the gain select signal (GAIN), and wherein the second gain setting feedback network comprises a second array of series coupled resistor circuits that is arranged in cooperation with a second gain selection multiplexer to select the second gain value in response to the gain select signal (GAIN).

12. The programmable gain amplifier circuit of claim 1, the trim adjustment circuit comprising an array of series coupled resistor circuits that is coupled between the first intermediate node and the second intermediate node, and a digitally controlled multiplexer circuit that is arranged to selectively couple one of the nodes associated with the array of series coupled resistors to the feedback node in response to the digital control signal (DCTL).

13. The programmable gain amplifier circuit of claim 10, wherein the array of series coupled resistor circuits are arranged to provide the blend of the first gain value and the second gain value according to a step size that corresponds to at least one of: a linear step, a non-linear step, a square law step, a square-root step, a cubed step, an equally spaced step, and a non-equally spaced step.

14. The programmable gain amplifier circuit of claim 1, further comprising a trim adjustment control circuit that is arranged to provide the digital control signal (DCTL) to the trim adjustment circuit in response to a gain setting signal (GAIN).

15. The programmable gain amplifier circuit of claim 1, further comprising a trim map circuit and a trim adjustment control circuit, wherein the trim map circuit is arranged to provide a trim setting signal (TRIM) to the trim adjustment control circuit in response to the gain setting signal (GAIN), and wherein the trim adjustment control circuit is responsive to the trim setting signal (TRIM) and the gain setting signal (GAIN) to provide the digital control signal (DCTL).

16. The programmable gain amplifier circuit of claim 1, further comprising a data register that is arranged to provide a gain setting signal (GAIN), a trim map circuit that is arranged to provide a trim setting signal (TRIM) in response to the gain setting signal (GAIN), and a trim adjustment control circuit that is arranged to provide the digital control signal (DCTL) in response to at least one of the gain setting signal (GAIN) and the trim setting signal (TRIM), wherein the data register is programmed by at least one of: a serial data signal, a parallel data signal, and an analog signal that is converted into a digital value.

17. A method for adjusting gains in a programmable gain amplifier, comprising:
selecting a first gain setting for the programmable gain amplifier from a first set of gain settings such that a first gain corresponds to $G1=[1+(RF1/RA1)]$;
selecting a second gain setting for the programmable gain amplifier from a second set of gain settings such that a second gain setting corresponds to $G2=[1+(RF2/RA2)]$;
cycling through each available trim setting for the selected first gain setting and the selected second gain setting by adjusting a blending factor between the first gain setting (G1) and the second gain setting (G2) in response to the trim setting such that the overall gain (G) is given by: G=G1*a+G2*b, where a+b=1, and wherein the value of a and b are determined by the blending factor;

determining a non-ideal gain factor associated with each available trim setting;

comparing the non-ideal gain factors to an ideal gain factor associated with selected gain setting;

selecting an appropriate trim setting from the available trim settings based on the comparison;

storing the value associated with the trim setting in a trim map; and indexing the stored value in the trim map according to the selected gain setting.

18. The method of claim 17, further comprising: retrieving the stored value from the trim map in response to a change in gain associated with the programmable gain amplifier, and adjusting a blending factor between two gain settings in response to the retrieved value from the trim map.

19. A method for adjusting a gain in a programmable gain amplifier, comprising:

identifying a gain change in the programmable gain amplifier;

adjusting a first gain setting in response to the identified gain change, wherein the first gain setting is associated with a first gain setting feedback circuit that has a first gain setting given by G1=[1+(RF1/RA1)];

adjusting a second gain setting in response to the identified gain change, wherein the second gain setting is associated with a first gain setting feedback circuit that has a second gain setting given by G2=[1+(RF2/RA2)];

retrieving a trim setting from a trim map in response to the identified gain change; and adjusting a blending factor between the first gain setting (G1) and the second gain setting (G2) in response to the identified gain change such that the overall gain (G) is given by: G=G1*a+G2*b, where a+b=1, and wherein the value of a and b are determined by the blending factor.

20. An apparatus for adjusting a gain in a programmable gain amplifier, comprising:

a means for selected a first gain (G1) in a first gain feedback circuit in response to a gain setting such that G1=[1+(RF1/RA1)];

a means for selecting a second gain (G2) in a second gain feedback circuit in response to the gain setting such that G2=[1+(RF2/RA2)];

a means for identifying a predetermined trim setting in response to the gain setting; and a means for adjusting a blending factor between the first gain and the second gain in response to at least one of the gain setting and the trim setting such that the overall gain (G) is given by: G=G1*a+G2*b, where a+b=1, and wherein the value of a and b are determined by the blending factor.

* * * * *

UNITED STATES PATENT AND TRADEMARK OFFICE
CERTIFICATE OF CORRECTION

PATENT NO. : 7,352,242 B1
APPLICATION NO. : 11/241172
DATED : April 1, 2008
INVENTOR(S) : Rodney Alana Hughes It is certified that error appears in the above-identified patent and that said Letters Patent is hereby corrected as shown below:

Title page, item [57] In the Abstract, Line 3, "is and" should read --is--

Column 4, Line 32, "feedback circuit GSI" should read --feedback circuit GS1--

Column 7, Line 49, "offset resistor RA01" should read --offset resistor RAO1--

Column 7, Line 51, "offset resistor RA02" should read --offset resistor RAO2--

Column 7, Line 52, "offset resistor RF02" should read --offset resistor RFO2--

Column 7, Line 63, "resistor circuit RA01" should read --resistor circuit RAO1--

Column 7, Line 65, "RA1 and RA01" should read --RA1 and RAO1--

Column 7, Line 67, "for resistor RF02" should read --for resistor RFO2--

Column 8, Line 2, "RF2 and RF02" should read --RF2 and RFO2--

Column 8, Line 23, "includes resistors RA01" should read --includes resistors RAO1--

Column 8, Line 42, "RX2 and RF01" should read --RX2 and RFO1--

Column 8, Line 66, "values of resistors RA01," should read --values of resistors RAO1,--

Column 8, Line 66, "RF02 and the span" should read --RFO2 and the span--

Column 9, Line 33, "Resistor RAIX" should read --Resistor RA1X--

UNITED STATES PATENT AND TRADEMARK OFFICE
CERTIFICATE OF CORRECTION

PATENT NO.       : 7,352,242 B1
APPLICATION NO.  : 11/241172
DATED            : April 1, 2008
INVENTOR(S)      : Rodney Alana Hughes It is certified that error appears in the above-identified patent and that said Letters Patent is hereby corrected as shown below:

Column 9, Line 34, "node TIX." should read --node T1X.--

Column 9, Line 34, "between node TIX" should read --between node T1X--

Signed and Sealed this

Thirtieth Day of September, 2008

JON W. DUDAS
*Director of the United States Patent and Trademark Office*